US006100776A

United States Patent [19]

Furutani et al.

[11] Patent Number: 6,100,776

[45] Date of Patent: Aug. 8, 2000

[54] HIGH-FREQUENCY COMPOSITE TRANSMISSION SECTION WITH SWITCH, LC FILTER, AND NOTCH FILTER

[75] Inventors: Koji Furutani, Moriyama; Ken Tonegawa, Otsu, both of Japan

[73] Assignee: Murata Manufacturing Co., Ltd., Japan

[21] Appl. No.: 09/235,657

[22] Filed: Jan. 22, 1999

[30] Foreign Application Priority Data

Jan. 22, 1998 [JP] Japan .................................. 10-010482

[51] Int. Cl.[7] ........................................................ H03H 7/01

[52] U.S. Cl. .......................... 333/136; 333/134; 333/176; 333/185

[58] Field of Search ..................................... 333/132, 134, 333/136, 176, 184, 185

[56] References Cited

U.S. PATENT DOCUMENTS 5,202,651 4/1993 Yoshimasu .......................... 333/176 X
5,260,862 11/1993 Marsh ................................. 333/176 X
5,783,976 7/1998 Furutani et al. ........................ 333/134

FOREIGN PATENT DOCUMENTS 0785590 7/1997 European Pat. Off. .
0820155 1/1998 European Pat. Off. .

*Primary Examiner*—Justin P. Bettendorf
*Attorney, Agent, or Firm*—Ostrolenk, Faber, Gerb & Soffen, LLP

[57] ABSTRACT

The invention provides a high-frequency composite unit, wherein: a two-terminal switch constituting a transmission section, an LC filter, and a notch filter are connected between a first terminal and a second terminal; and said two-terminal switch, said LC filter, and said notch filter are integrated into a layered structure in which a plurality of dielectric layers are stacked. The above high-frequency composite unit has high performance, which can handle high-frequency signals of multiple frequency bands that are relatively adjacent.

1 Claim, 8 Drawing Sheets

HIGH-FREQUENCY COMPOSITE TRANSMISSION SECTION WITH SWITCH, LC FILTER, AND NOTCH FILTER

BACKGROUND OF THE INVENTION

1. Field of the Invention

The present invention relates to a high-frequency composite unit for use in mobile communication apparatuses such as a cellular phone, and the like, that can handle multiple frequency bands.

2. Description of the Related Art

When the frequency bands of two mobile communication systems, such as a GSM (Global System for Mobile communications) in the 900 MHz band and a DCS (Digital Cellular System) in the 1.8 GHz band, are relatively close to each other, the two mobile communication systems shares an antenna between them. FIG. 10 is a block diagram showing a structure in which an antenna is shared between the conventional types of mobile communications with different frequency bands. In FIG. 10, reference numeral 51 denotes an antenna, reference numeral 52 denotes a duplexer, reference numeral 53 denotes a switch on the GSM side, while reference numeral 54 denotes a switch on the DCS side. A first terminal 53*a* of the GSM-side switch 53 is connected to the antenna 51 through the duplexer 52, while a second terminal 53*b* and a third terminal 53*c* are respectively connected to Txgsm, which is a transmitting circuit of the GSM, and to Rxgsm, which is a receiving circuit of the GSM. In contrast, a first terminal 54*a* of the DCS-side switch 54 is connected to the antenna 51 through the duplexer 52, while a second terminal 54*b* and a third terminal 54*c* are respectively connected to Txdcs, which is-a transmitting circuit of the DCS, and to Rxdcs, which is a receiving circuit of the DCS. In addition, the duplexer 52 performs a division of frequency bands for each of the GSM and the DCS, and the GSM-side switch 53 and the DCS-side switch 54 perform switching between transmission and reception. The arrangement above permits the single antenna 51 to perform reception and transmission in the two mobile communication systems, that is, the GSM and the DCS.

However, in the conventional arrangement sharing an antenna, since the single antenna is connected to the GSM-side switch and the DCS-side switch through the duplexer, and since the transmitting and receiving circuits are connected through these switches, there is a problem of the increased number of components. Thus, this leads to difficulty in miniaturizing a mobile communication device in which the components are mounted.

SUMMARY OF THE INVENTION

To overcome the problem described above, preferred embodiments of the present invention provide a high-frequency composite unit with high performance, which can handle high frequency signals in multiple frequency bands which are relatively close to each other.

One preferred embodiment of the present invention provides a high-frequency composite unit, wherein: a two-terminal switch constituting a transmission section, an LC filter, and a notch filter are connected between a first terminal and a second terminal; and said two-terminal switch, said LC filter, and said notch filter are integrated into a layered structure in which a plurality of dielectric layers are stacked.

According to the above structure and arrangement, wiring for connecting the two-terminal switch, the LC filter, and the notch filter can be installed inside the layered structure, so that losses due to wiring can be reduced so as to obtain a high-frequency composite unit with high performance.

Furthermore, since the high-frequency composite unit has the LC filter, the second and third harmonics which occur when a signal is transmitted can be blocked. Accordingly, in radio equipment with the high-frequency composite unit, no noise occurs when a signal is transmitted so as to perform a satisfactory transmission.

Furthermore, since the high-frequency composite unit has a notch filter, a control of the voltage applied to a second switching element of the notch filter permits the inductance components and capacitance components of an LC resonant circuit composed of third inductance elements, third capacitance elements, resonators, and second switching elements to be controlled. As a result, a resonance frequency of the notch filter can be controlled. Accordingly, since the frequency band of a high-frequency signal passing through the notch filter can be changed, it is possible for the single high-frequency composite unit to handle multiple high-frequency signals having different frequency bands.

In the above described high-frequency composite unit, said two-terminal switch may be composed of at least a first inductance element, at least a first capacitance element, and at least a first switching element; said LC filter may be composed of at least a second inductance element, and at least a second capacitance element; said notch filter may be composed of at least a third inductance element, at least a third capacitance element, at least a resonator, and at least a second switching element; and said first, second and third inductance elements, said first, second and third capacitance elements, said resonator, and said first and second switching elements may be disposed in or mounted on said layered structure.

The above structure and arrangement permits a compact type of high-frequency composite unit to be produced, and at the same time, a small-sized mobile communication apparatus equipped with such a high-frequency composite unit can be obtained.

In the above described high-frequency composite unit, said resonator may be an open stub.

According to the above structure and arrangement, they are not influenced by parasitic inductance of second switching elements of the notch filter, so that the attenuation of insertion loss can be increased.

Other features and advantages of the present invention will become apparent from the following description of the invention which refers to the accompanying drawings.

DESCRIPTION OF THE PREFERRED EMBODIMENTS

Figure 1:
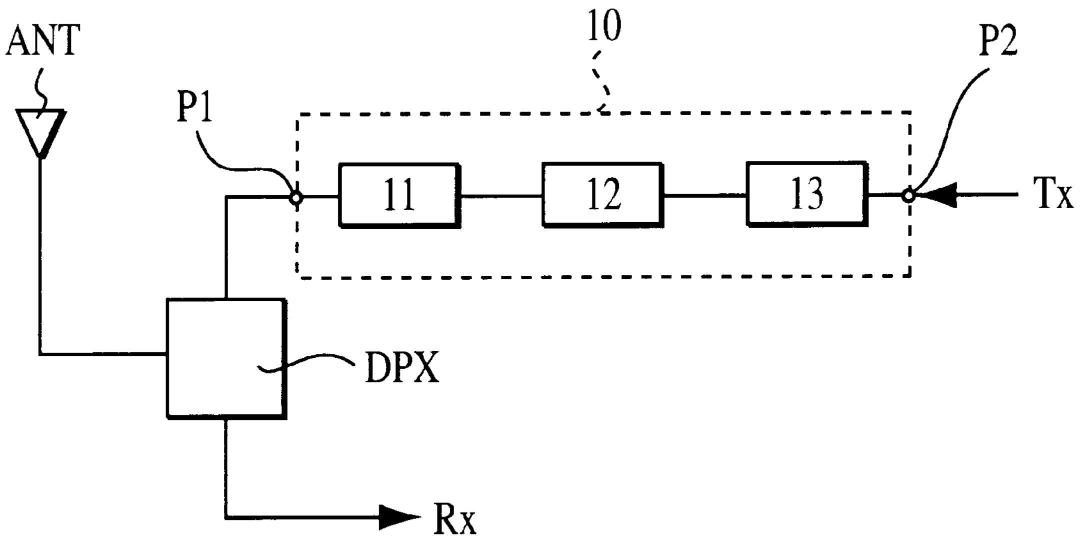
FIG. 1 is a block diagram of a high-frequency composite unit according to one preferred embodiment of the present invention.

FIG. 1 shows a block diagram of a high-frequency composite unit employed in one preferred embodiment of the present invention. In the high-frequency composite unit 10, a two-terminal switch 11, an LC filter 12, and a notch filter 13 are integrated to form a transmission section; also, a first terminal P1 disposed on an antenna ANT side is connected to a duplexer DPX, while a second terminal P2 disposed on a transmission circuit Tx side is connected to the transmission circuit Tx.

The two-terminal switch 11 serves to prevent a received signal from entering the transmitting circuit when it is received. The LC filter 12, which is a Low Pass Filter, serves to block the third harmonic on a low-frequency side and the second harmonic and the third harmonic on a high-frequency side.

In contrast, the notch filter 13 serves to allow a high-frequency signal to pass through and to block the second harmonic of the high-frequency signal, when the low-frequency side is used, while it serves to allow the high-frequency signal to pass through when the high-frequency side is used.

Figure 2:
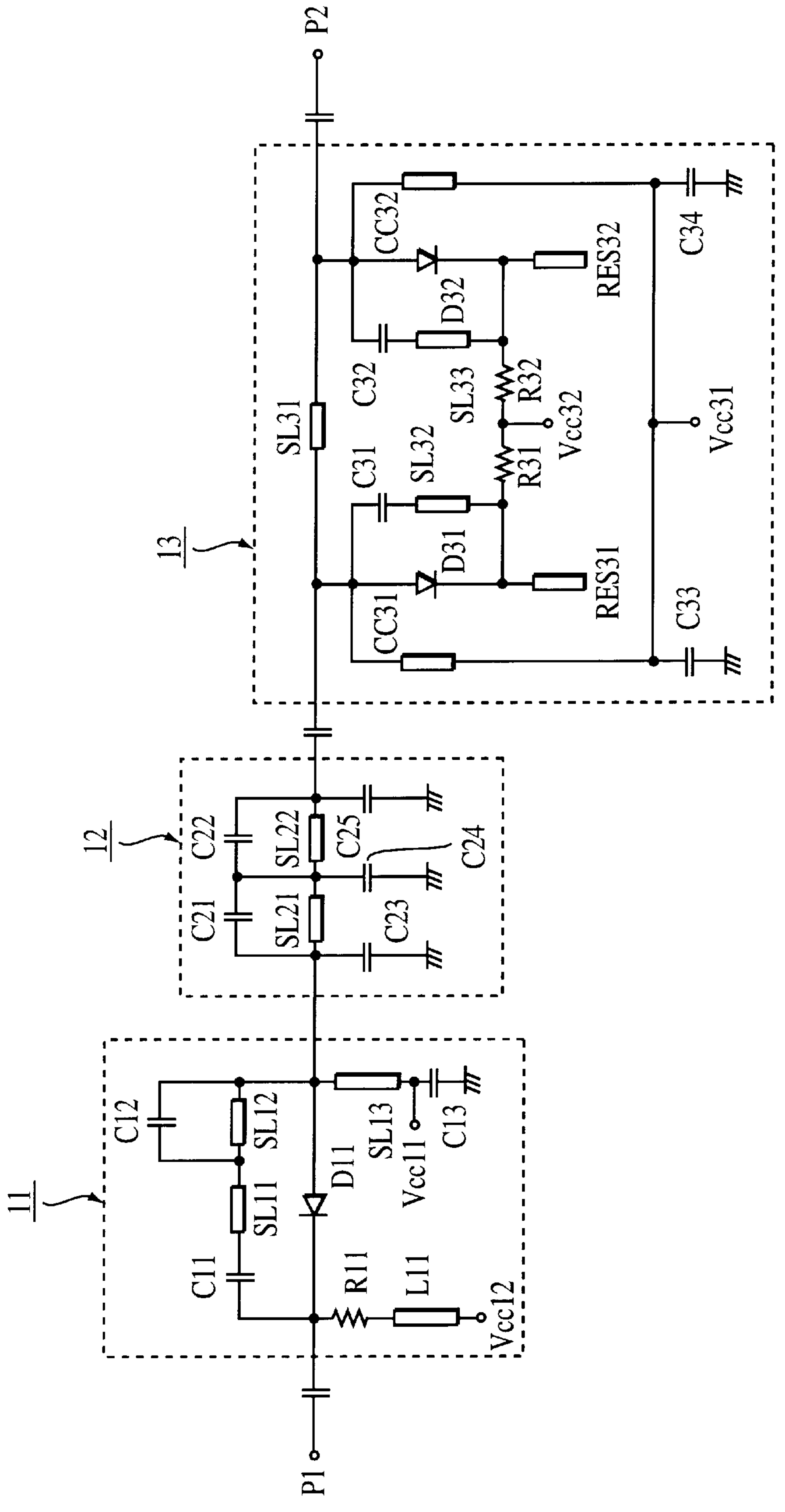
FIG. 2 is a circuit diagram of the high-frequency composite unit shown in FIG. 1.

FIG. 2 shows a circuit diagram of the high-frequency composite unit 10. The two-terminal switch 11 is composed of first sending lines SL11 to SL13, and a coil L11, which are first inductance elements, first condensers C11 to C13, which are first capacitance elements, a first diode D11, which is a first switching element, and a resistor R11.

Between the first terminal P1 and the second terminal P2 is connected the first diode D11 in such a manner that the cathode is oriented to the first terminal P1 side, while the anode is oriented to the second terminal P2 side. Between the anode and the cathode of the first diode D11 are connected in series the first sending lines SL11 and SL12, and the first condenser C11; and the first sending line SL12 is connected in parallel to the first condenser C12.

Furthermore, between the anode of the first diode D11 and a ground are connected the first sending line SL13 and the first condenser C13; and the junction of the first sending line SL13 and the first condenser C13 is connected to a control terminal Vcc11; and the cathode of the first diode D11 is connected to a control terminal Vcc12 through a series circuit composed of the resistor R11 and the coil L11.

The LC filter 12 is composed of second sending lines SL21 and SL22, which are second inductance elements, and second condensers C21 to C25, which are second capacitance elements.

Between the anode of the first diode D11 of the two-terminal switch 11 and the second terminal P2 are connected in series the second sending lines SL21 and SL22, to which second condensers C21 and C22 are connected in parallel. Meanwhile, second condensers C23, C24, and C25 are respectively connected between both ends of the second sending lines SL21 and SL22 and the grounds.

The notch filter 13 is composed of third sending lines SL31 to SL33, which are third inductance elements, third condensers C31 to C34, which are third capacitance elements, resonators RES31 and RES32 which are open stubs, second diodes D31 and D32, which are second switching elements, choke coils CC31 and CC32, and resistors R31 and R32.

Between the LC filter 12 and the second terminal P2 is connected the third sending line SL31 between an end of the third sending line SL31 and a ground are connected in series the third condenser C31, the third sending line SL32, and the resonator RES31, while between the other end of the third sending line SL31 and a ground are connected in series the third condenser C32, the third sending line SL33, and the resonator RES32.

A series circuit composed of the third condenser C31 and the third sending line SL32 is connected to the second diode D31 in parallel, while a series circuit composed of the third condenser C32 and the third sending line SL33 is connected to the second diode D32 in parallel.

The junction of the third condenser C31 and the anode of the second diode D31, and the junction of the third condenser C32 and the anode of the second diode D32 are connected to a control terminal Vcc31 through the choke coils CC31 and CC32, respectively. Furthermore, the control terminal Vcc31 side of the choke coils CC31 and CC32 is also connected to a ground through the third condensers C33 and C34, respectively.

The junction of the third sending line SL32 and the cathode of the second diode D31, and the junction of the third sending line SL33 and the cathode of the second diode D32 are connected to a control terminal Vcc32 through the resistors R31 and R32.

In this state, the choke coils CC31 and CC32, and the resistors R31 and R32 serve to prevent a high-frequency signal from flowing into the control terminals Vcc31 and Vcc32, when a voltage is applied to the second diodes D31 and D32.

The arrangement above allows the high-frequency composite unit 10 to be produced, in which the two-terminal switch 11, the LC filter 12, and the notch filter 13 are connected in series between the first terminal P1 and the second terminal P2.

Figure 3:
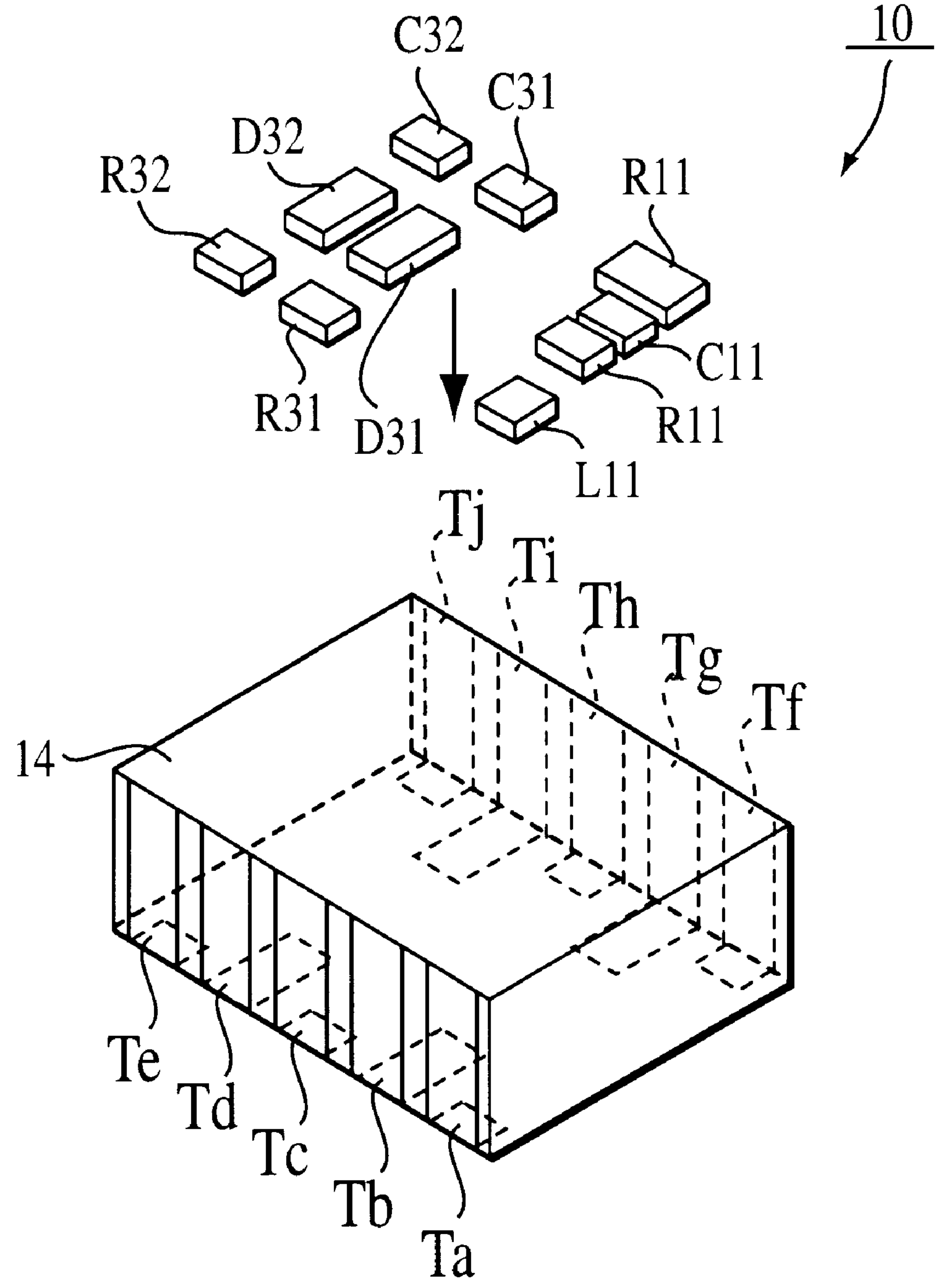
FIG. 3 is a perspective view of the high-frequency composite unit shown in FIG. 2.
Figure 4A:
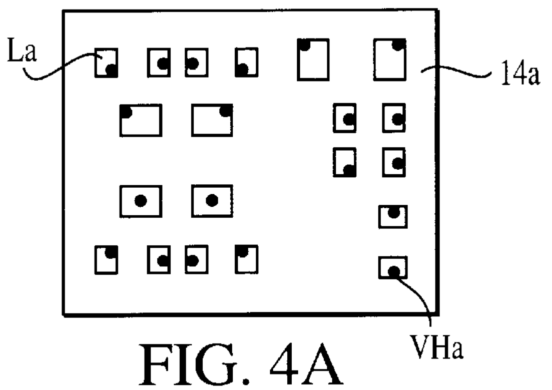
FIGS. 4A to 4F are top views of a first dielectric layer to a sixth dielectric layer constituting a layered structure of the high-frequency composite unit shown in FIG. 3.
Figure 4B:
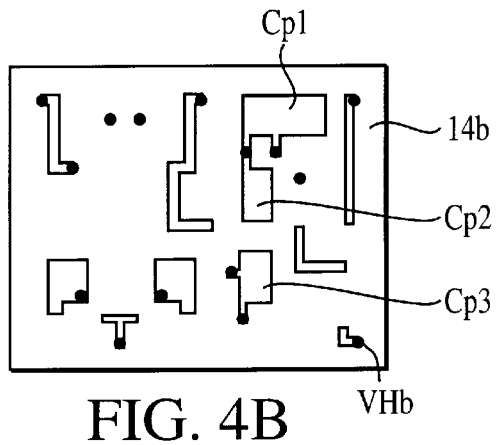
Figure 4C:
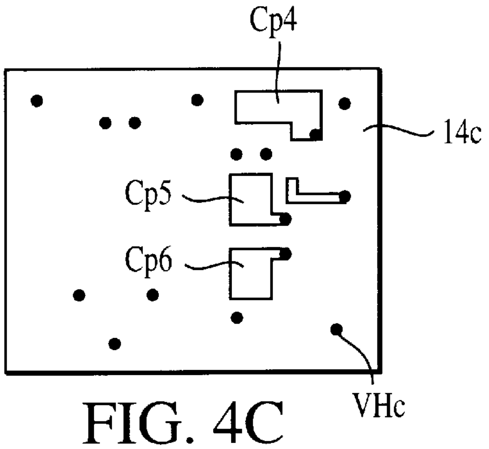
Figure 4D:
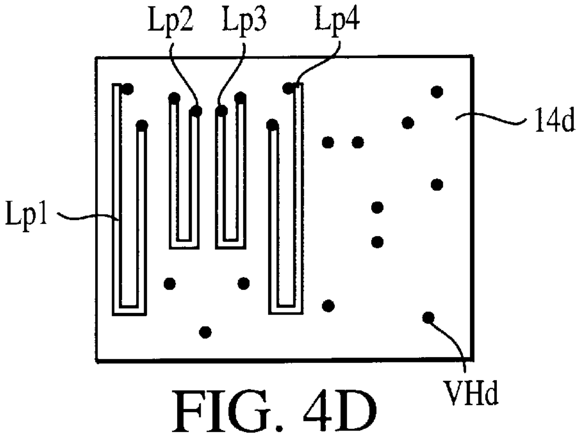
Figure 4E:
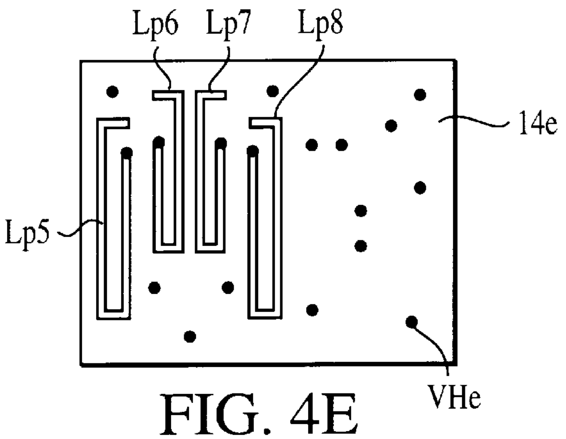
Figure 4F:
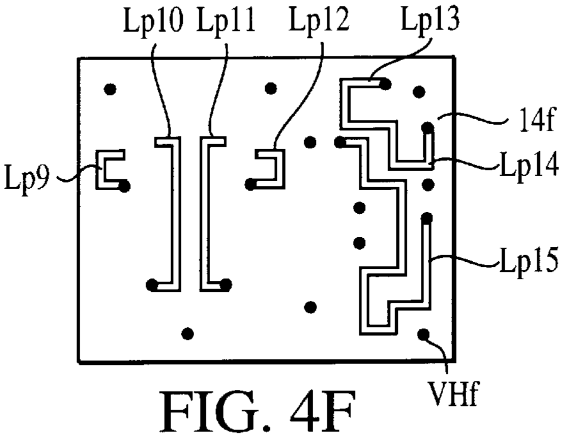
Figure 5A:
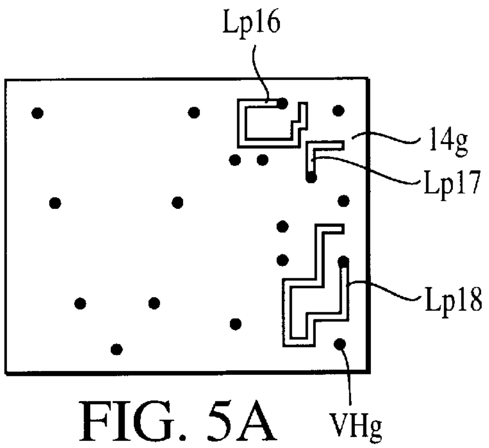
FIGS. 5A to 5F are top views of a seventh dielectric layer to a twelfth dielectric layer constituting a layered structure of the high-frequency composite unit shown in FIG. 3.
Figure 5B:
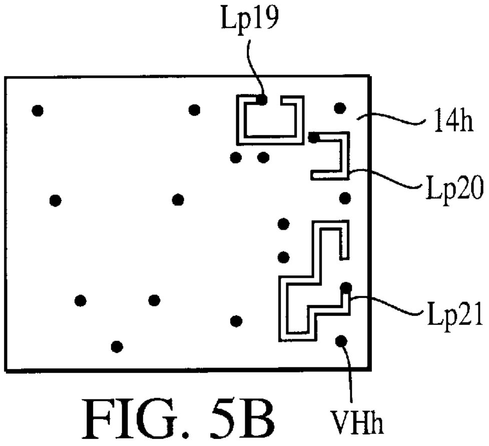
Figure 5C:
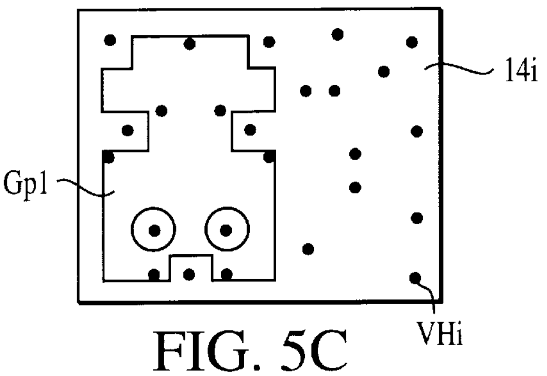
Figure 5D:
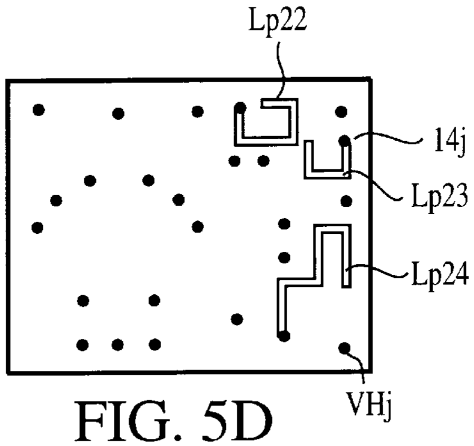
Figure 5E:
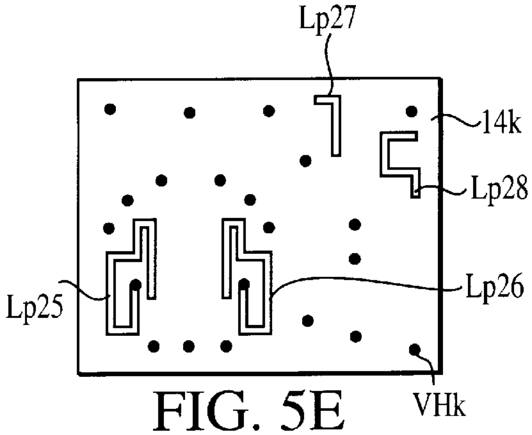
Figure 5F:
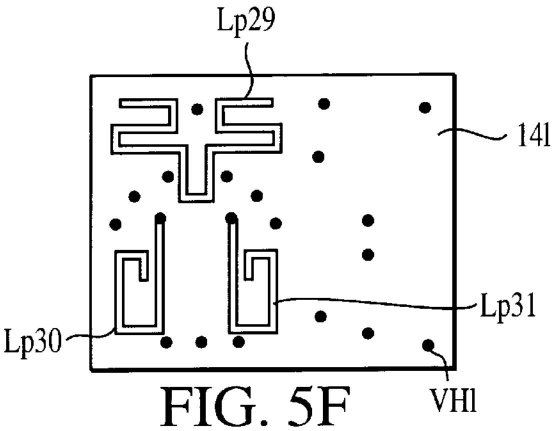
Figure 6A:
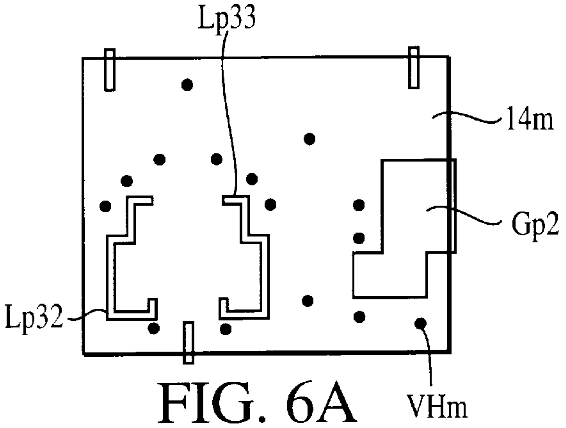
FIGS. 6A to 6E are top views of a thirteenth dielectric layer to a seventeenth dielectric layer.
Figure 6B:
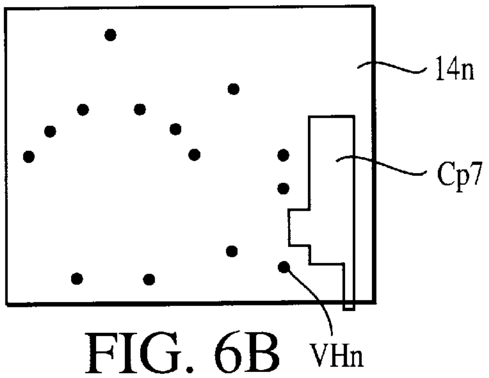
Figure 6C:
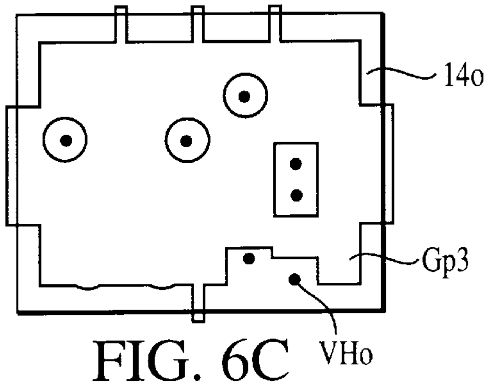
Figure 6D:
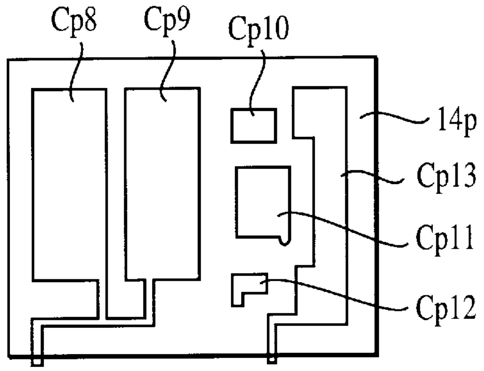
Figure 6E:
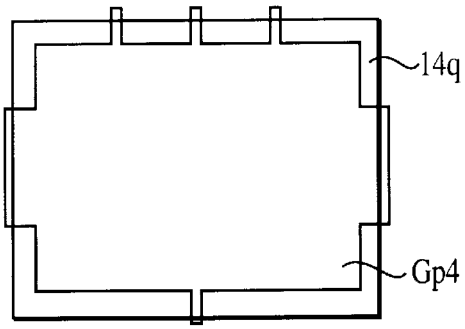
Figure 6F:
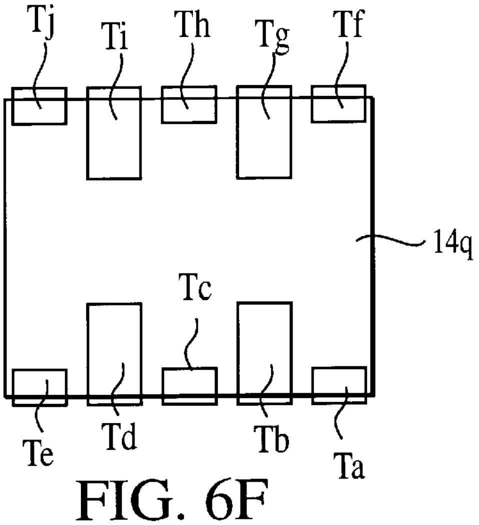
FIG. 6F is a bottom view of a seventeenth dielectric layer, which constitute a layered structure of the high-frequency composite unit shown in FIG. 3.

FIG. 3 shows a perspective view of the high-frequency composite unit 10 shown in FIG. 2. The high-frequency composite unit 10 includes a layered structure 14 containing the first to third sending lines SL11 to SL13, SL21, SL22, SL31 to SL33, the first to third condensers C12, C13, C21 to C25, C33, and C34, the resonators RES31 and RES32, and the choke coils CC31 and CC32 (not shown) therein; on the top face of the layered structure 14, which is a main surface of the same, are mounted the first and second diodes D11, D31, and D32, the first condenser C11, the coil L11, the resistor R11, the third condensers C31 and C32, and the resistors R31 and R32.

Furthermore, ten external electrodes Ta to Tj are provided from the sides to the bottom of the layered structure 14; among these external electrodes Ta to Tj, the five external electrodes Ta to Te are provided on one side of the layered structure 14, while the other five external electrodes Tf to Tj are provided on the other side of the layered structure 14; and the external electrode Ta is the first terminal P1, the external terminals Tb to Td, and Th, are ground terminals, the external electrode Te is the second terminal P2, and the external electrodes Tf, Tg, Ti, and Tj are control terminals for controlling the voltage applied to the diodes D11, D31, and D32.

FIGS. 4A to 4F, FIGS. 5A to 5F, and FIGS. 6A to 6F show a top view and a bottom view of each dielectric layer forming the layered structure of the high-frequency composite unit 10. The layered structure 14 (FIG. 3) is formed by stacking the first to seventeenth dielectric layers, namely, 14*a* to 14*q*, sequentially from the top.

On the top surface of the first dielectric layer 14*a* is printed a land La to form for mounting the first and second diodes D11, D31, and D32, the first condenser C11, the coil L11, the resistor R11, the third condensers C31 and C32, and the resistors R31 and R32 thereon. On the top surfaces of the second, third, fourteenth, and sixteenth dielectric layers 14*b*, 14*c*, 14*n*, and 14*p* are printed condenser electrodes Cp1 to Cp13 formed of conductive layers respectively so as to be formed.

Furthermore, strip electrodes Lp1 to Lp33, comprising conductive layers, are respectively formed by printing on the upper surfaces of the fourth to eighth dielectric layers 14*d* to 14*h* and the tenth to thirteenth dielectric layers 14*j* to 14*m*.

Ground electrodes Gp1 to Gp4, comprising conductive layers, are respectively formed by printing on the upper surfaces of the ninth, thirteenth, fifteenth, and seventeenth dielectric layers 14*i*, 14*m*, 14*o*, and 14*q*. In contrast, on the bottom of the seventeenth dielectric layer 14*q* (FIG. 6(*f*)) are respectively formed by printing external terminals Ta and Te which are supposed to be the first and second terminals P1 and P2, and external terminals Tb to Td, and Th, which are supposed to be ground terminals, and external terminals Tf, Tg, Ti, and Tj, which are supposed to be control terminals. In addition, on specified positions of the first to sixteenth dielectric layers 14*a* to 14*o* are disposed via-hole electrodes VHa to VHo for connecting condenser electrodes Cp1 to Cp13, strip electrodes Lp1 to Lp33 and ground electrodes Gp1 to Gp3 thereto.

The condenser electrodes Cp1 and Cp4 form a first condenser C12; the condenser electrodes Cp2 and Cp5 form a second condenser C21; the condenser electrodes Cp3 and Cp6 form a second condenser C22; the condenser electrodes Cp7 and Cp13 and the ground electrodes Gp2, Gp3, and Gp4 form a first condenser C13; the condenser electrode Cp8 and the ground electrodes Cp3 and Cp4 form a third condenser C34; the condenser electrode Cp10 and the ground electrodes Cp3 and Cp4 form a second condenser C23; the condenser electrode Cp11 and ground electrodes Cp3 and Cp4 form a second condenser C24; and the condenser electrode Cp12 and the ground electrodes Cp3 and Cp4 form a second condenser C25.

Meanwhile, the strip electrodes Lp1, Lp5, and Lp9 form a choke coil CC32; the strip electrodes Lp2, Lp6, and Lp10 form a third sending line SL33; the strip electrodes Lp3, Lp7, and Lp11 form a third sending line SL32; the strip electrodes Lp4, Lp8, and Lp12 form a choke coil CC31; the strip electrodes Lp13, Lp16, Lp19, Lp22, and Lp27 form a first sending line SL12; the strip electrodes Lp14, Lp17, Lp20, Lp23, and Lp28 form a first sending line SL11; the strip electrodes Lp15, Lp18, Lp21, and Lp24 form a first sending line SL13; the strip electrodes Lp25, Lp30, Lp32 form a resonator RES31; and the strip electrodes Lp26, Lp31, Lp33 form a resonator RES32.

The operation of the high-frequency composite unit 10 having the arrangement above will be described using the GSM (900 MHz band) for a low-frequency side, and the DCS (1.8 GHz band) for a high-frequency side.

In the case of a transmission from the GSM, the second diodes D31 and D32 of the notch filter 13 are turned ON (Vcc31=3 V, Vcc32=0 V) to make them inductor components. The third sending lines SL32 and SL33 and the second diodes D31 and D32 form the inductance components of the LC resonator circuit composed of the third sending lines SL32 and SL33, the third condensers C31 and C32, the resonators RES31 and RES32, and the second diodes D31 and D32, while the third condensers C31 and C32 form the capacitance components of the LC resonator circuit. This arrangement permits the notch filter 13 to make a sending signal of the GSM pass through, blocking the second harmonic of the sending signal of the GSM.

On the other hand, the LC filter 12 blocks the third harmonic of the sending signal of the GSM; the two-terminal switch 11 permits the first diode D11 to be turned ON (Vcc11=3 V, Vcc12=0 V) so as to make the sending signal of the GSM pass therethrough.

Figure 7:
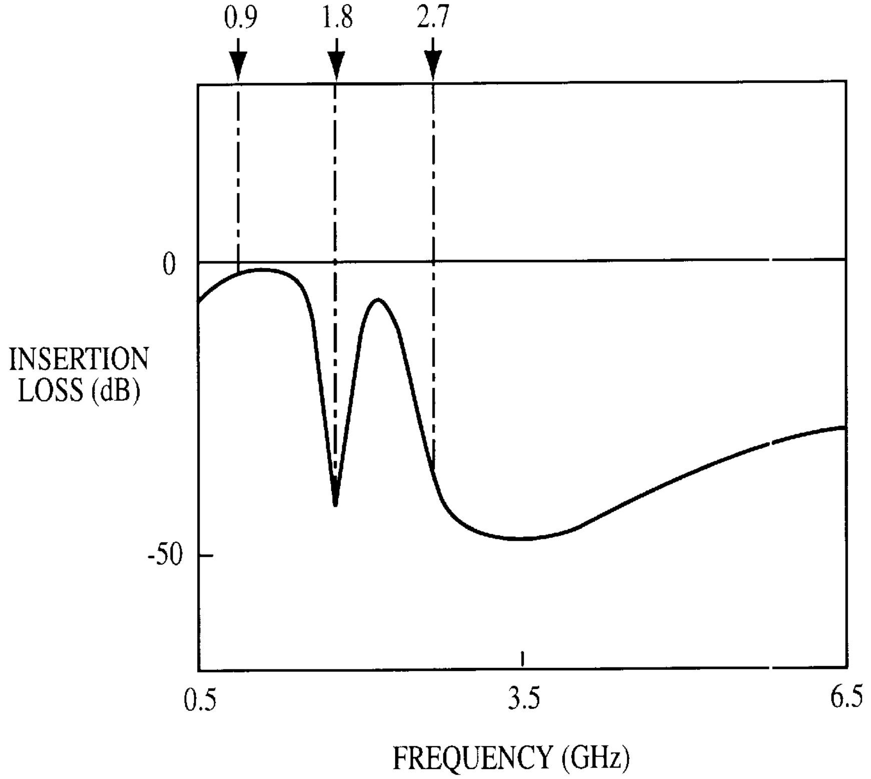
FIG. 7 is a graph showing insertion losses which occur when a signal of the low-frequency side (GSM) is transmitted.

The insertion loss of the high-frequency compound unit 10 in this case is shown in FIG. 7. In this figure, it is clear that the insertion loss at about 900 MHz is about −1 dBd, the insertion loss at about 1.8 GHz, which is the second harmonic, is about −40 dBd, and the insertion loss at about 2.7 GHz, which is the third harmonic, is about −40 dBd; consequently, the sending signal of the GSM is allowed to pass through, while the second and third harmonics of the sending signal of the GSM are completely blocked.

In the case of a transmission from the DCS, the second diodes D31 and D32 of the notch filter 13 are turned OFF (Vcc31=0 V, Vcc32=3 V) to make them capacitance components; while the inductance components of the LC resonator circuit composed of the third sending lines SL32 and SL33, the third condensers C31 and C32, the resonators RES31 and RES32, and the second diodes D31 and D32 consist of the third sending lines SL32 and SL33, and the capacitance components of the LC resonator circuit consist of the third condensers C31 and C32, and the second diodes D31 and D32. This arrangement permits the notch filter 13 to make a sending signal of the DCS pass therethrough.

The LC filter 12 blocks the second and third harmonics of the sending signal of the DCS; the two-terminal switch 11 allows the first diode D11 to be turned ON (Vcc11=3 V, Vcc12=0 V) so as to make the sending signal of the DCS pass therethrough.

Figure 8:
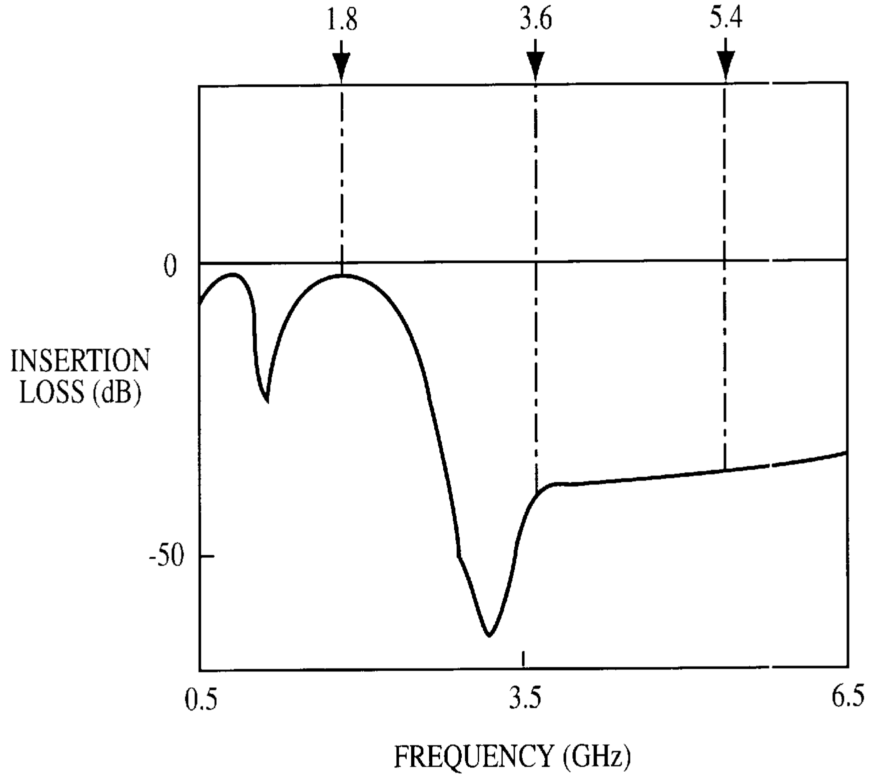
FIG. 8 is a graph showing insertion losses which occur when a signal of the high-frequency side (DCS) is transmitted.

The insertion loss of the high-frequency composite unit 10 in this case is shown in FIG. 8. In this figure, it is clear that the insertion loss at about 1.8 GHz is about −2 dBd, the insertion loss at about 3.6 GHz, which is the second harmonic, is about −42 dBd, the insertion loss at about 5.4 GHz, which is the third harmonic, is about −34 dBd; consequently, the sending signal of the DCS is allowed to pass through, while the second and third harmonics of the sending signal of the DCS are completely blocked.

In the case of reception of the GSM and DCS, the two-terminal switch 11 allows the first diode D11 to be turned OFF (Vcc11=0 V, Vcc12=3 V), resulting in blocking of the received signals of the GSM and the DCS by the two-terminal switch 11.

Figure 9:
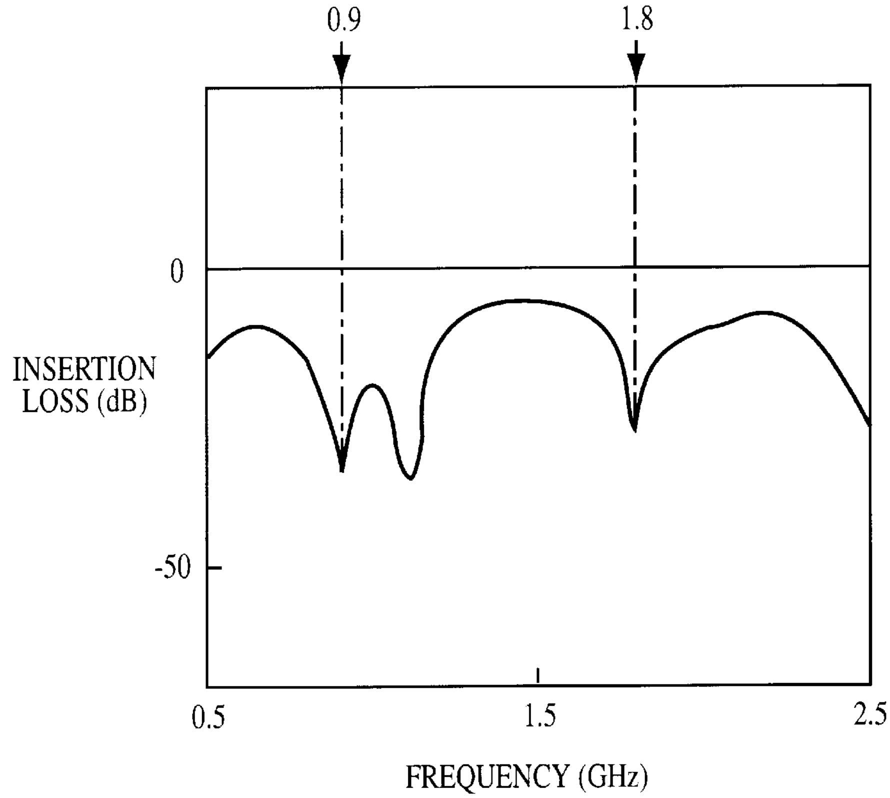
FIG. 9 is a graph showing insertion losses which occur when signals of the low-frequency side (GSM) and high-frequency side (DCS) are received.
Figure 10:
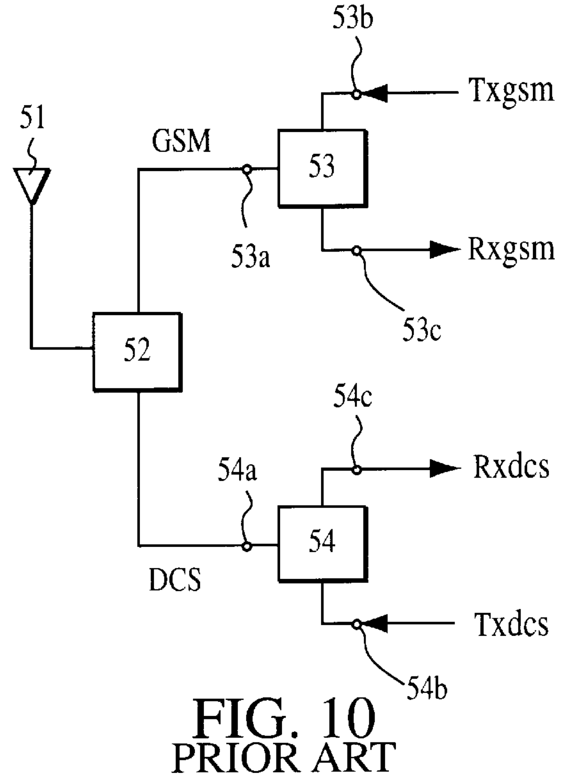
FIG. 10 PRIOR ART
FIG. 10 is a block diagram showing a structure in which an antenna is shared between the conventional types of mobile communication devices having different frequency bands.

The insertion loss of the high-frequency composite unit 10 in this case is shown in FIG. 9. In this figure, it is clear that the insertion loss at about 900 MHz is about −35 dBd, and the insertion loss at about 1.9 GHz is about −25 dBd;

consequently, the received signals of the GSM and the CDS are completely blocked.

In the high-frequency composite unit of the above described embodiment, since the two-terminal switch, the LC filter, and the notch filter, which constitute a transmission part connected between the first terminal and the second terminal, are integrated into a layered structure, wiring for connecting the two-terminal switch, the LC filter, and the notch filter can be arranged as via-hole electrodes inside the layered structure, as shown in FIGS. 4 and 6. As a result, this permits a loss due to wiring to be reduced so as to obtain a high-frequency composite unit with high performance.

In addition, since the high-frequency composite unit has an LC filter, the second and third harmonics that occur when a signal is transmitted can be blocked. Accordingly, in radio equipment with the high-frequency composite unit, no noise occurs when a signal is transmitted, so that satisfactory transmission can be performed.

Furthermore, since the high-frequency composite unit has a notch filter, a control of the voltage applied to the third diode of the notch filter permits the inductance components and capacitance components of the LC resonant circuit composed of the third sending lines, the third condensers, resonators, and the second diodes to be controlled. As a result, a resonance frequency of the notch filter can be controlled. Accordingly, since the frequency band of a high-frequency signal passing through the notch filter can be changed, it is possible for the single high-frequency composite unit to handle multiple high-frequency signals having different frequency bands.

In addition, the two-terminal switch is composed of the first sending lines, the first condensers, and the first diode; the LC filter is composed of the second sending lines and the second condensers; and the notch filter is composed of the third sending lines, the third condensers, resonators, and the second diodes so as to be contained or mounted in the layered structure. Therefore, this arrangement permits a compact type of high-frequency composite unit to be produced, and at the same time, a small-sized mobile communication device equipped with such a high-frequency composite unit can be obtained.

Moreover, the resonators of the notch filter are composed of open stubs, so that they are not influenced by parasitic inductance of the diodes, and attenuation of insertion loss can be made larger.

The above described embodiment has been described for a case in which the two-terminal switch, the LC filter, and the notch filter that constitute the transmission section are connected between the first terminal and the second terminal in the order of the two-terminal switch, the LC filter, and the notch filter. An order for connecting these components, however, is not restricted to this case, and even if other orders are applied, the same advantages can be obtained.

In addition, although the embodiment has been shown for a case in which the LC filter and the notch filter are Low Pass Filters, the LC filter and the notch filter may be High Pass Filters, Band Pass Filters, or Band Elimination Filters, with the same advantages being obtainalbe.

In addition, the embodiment has been described for a case of using a diode as a switching element. However, transistors such as a bipolar transistor, a field effect transistor, etc., can also be applied to obtain the same advantages.

Furthermore, although, in the embodiment, the control terminal is connected via the choke coil or the resistor, any kind of element can be applied as long as it can prevent a high-frequency signal from flowing into the control terminal when a voltage is applied to a pin diode.

The embodiment above has also been described for a case in which the high-frequency composite unit of the present invention is employed in a combination of the GSM and the DCS. However, without being restricted to this case, other combinations can be applied. For example, it is possible to use a combination of the GSM and the PCS (Personal Communication Services), a combination of the AMPS (Advanced Mobile Phone Services) and the PCS, a combination of the GSM and the DECT (Digital European Cordless Telephone), and a combination of the PDC (Personal Digital Cellular) and the PHS (Personal Handy-phone System), etc.

While the invention has been particularly shown and described with reference to preferred embodiments thereof, it will be understood by those skilled in the art that the forgoing and other changes in form and details may be made therein without departing from the spirit of the invention.

What is claimed is:

1. A high-frequency composite unit, wherein:

a transmission section comprising a two-terminal switch, an LC filter, and a notch filter connected between a first terminal and a second terminal;

said two-terminal switch, said LC filter, and said notch filter are integrated into a layered structure in which a plurality of dielectric layers are stacked;

said two-terminal switch is composed of at least a first inductance element, at least a first capacitance element, and at least a first switching element;

said LC filter is composed of at least a second inductance element, and at least a second capacitance element;

said notch filter is composed of at least a third inductance element, at least a third capacitance element, at least one resonator comprising an open stub, and at least a second switching element; and said first, second and third inductance elements, said first, second and third capacitance elements, said at least one resonator, and said first and second switching elements are disposed in or mounted on said layered structure.

* * * * *